(12) United States Patent
Ruediger et al.

(10) Patent No.: US 10,056,394 B1
(45) Date of Patent: Aug. 21, 2018

(54) FERROELECTRIC TUNNEL JUNCTION AND METHOD OF FABRICATION THEREOF

(71) Applicants: INSTITUT NATIONAL DE LA RECHERCHE SCIENTIFIQUE, Quebec (CA); PLASMIONIQUE INC., Brossard (CA)

(72) Inventors: Andreas Ruediger, Saint-Bruno-de-Montarville (CA); Fabian Ambriz-Vargas, Montreal (CA); Gitanjali Kolhatkar, Montreal (CA); Reji Thomas, Kerala (IN); Azza Hadj Youssef, Montreal (CA); Rafik Nouar, Boucherville (CA); Andranik Sarkissian, Brossard (CA); Marc-André Gauthier, Saint-Bruno-de-Montarville (CA)

(73) Assignees: INSTITUT NATIONAL DE LA RECHERCHE SCIENTIFIQUE, Quebec (CA); PLASMIONIQUE INC., Brossard (CA)

( * ) Notice: Subject to any disclaimer, the term of this patent is extended or adjusted under 35 U.S.C. 154(b) by 0 days.

(21) Appl. No.: 15/630,153

(22) Filed: Jun. 22, 2017

(51) Int. Cl.
*H01L 21/02* (2006.01)
*H01L 27/11507* (2017.01)
*H01L 49/02* (2006.01)

(52) U.S. Cl.
CPC .. *H01L 27/11507* (2013.01); *H01L 21/02181* (2013.01); *H01L 21/02189* (2013.01); *H01L 21/02194* (2013.01); *H01L 21/02266* (2013.01); *H01L 28/55* (2013.01); *H01L 28/60* (2013.01)

(58) Field of Classification Search
CPC ......... H01L 27/11507; H01L 27/11502; H01L 21/02181; H01L 21/02189; H01L 21/02194; H01L 21/02266; H01L 21/02631; H01L 21/28291; H01L 28/55; H01L 28/60
USPC .......................................... 257/532
See application file for complete search history.

(56) References Cited

U.S. PATENT DOCUMENTS

2016/0099354 A1* 4/2016 Ramaswamy .... H01L 29/78391 257/295
2016/0336312 A1* 11/2016 Yan ...................... H01L 27/0711
2016/0372478 A1* 12/2016 Ino ........................ C23C 14/083

OTHER PUBLICATIONS

Crassous et al., Giant tunnel electroresistance with PbTiO 3 Ferroelectric tunnel barriers, Applied Physics letters, vol. 96, Jan. 25, 2010.
Han Joon Kim, Grain size engineering for ferroelectric Hf0.5Zr0. 5O2 films by an insertion of Al2O3 interlayer,Applied Physics letters, vol. 105, Nov. 14, 2014.
Pavunny et al., Optical Dielectric Function Modeling and Electronic Band Lineup Estimation of Amorphous High-k LaGdO3 Films, ECS Journal of Solid and Technology, vol. 1, pp. N53-N57, Aug. 4, 2015.
Pavunny et al., Optical properties of amorphous high-k LaGdO3 films and its band alignment with Si, Journal of Applied Science 111, Feb. 29, 2012.

(Continued)

*Primary Examiner* — Tu-Tu Ho
(74) *Attorney, Agent, or Firm* — Gwendoline Bruneau

(57) ABSTRACT

A method for fabricating a ferroelectric tunnel junction, comprising growing a hafnium zirconium oxide film barrier layer by sputtering in the presence of oxygen at a temperature of at most 425° C., on a conductive material as a bottom electrode, and depositing a conductive material as a top electrode.

14 Claims, 11 Drawing Sheets

(56) References Cited

OTHER PUBLICATIONS

Qi Liu, He Tian, Lei Bi et al., Fatigue mechanism of yttrium-doped hafnium oxide ferroelectric thim films fabricated by pulsed laser deposition, Phys. Chem, Chem. Phys., 2017, 19, 3486.
Abuwasib et al., Scaling of electroresisyance effect in fully integrated ferroelectric tunnel junctions, Applied Physics Letters 108, Apr. 13, 2016.
K.J. Choi et al., Enhancement of Ferroelectrocity in Strained BaTiO3 Thin Films, Science Mag, vol. 306, pp. 1005-1009, Nov. 5, 2004.
Wen et al., Ferroelectric-field-effect-enhanced electroresistance in metal/ferroelectric/semiconductor tunnel junctions, Natural materials, vol. 12, pp. 617-621, Jul. 2013.
Tsymbal et al., Beyond the barrier, Nature Materials, vol. 12, pp. 602-604, Jul. 2013.
Baldi et al., Emerging memories, Solid-State Electronics, vol. 102, pp. 2-11, Jun. 9, 2014.
Jeong et al., Emerging memories: resistive switching mechanisms and current status, IOP publishings, Reports on Progress in Physics, vol. 75, pp. 1-31, Jun. 28, 2012.
Makarov et al., Emerging memory technologies: Trend, Challenges, and modeling methods, Mciroelectronics Reliability, vol. 52 pp. 628-634, Nov. 16, 2011.
Garcia et al., Ferroelectric tunnel junctions for information storage and processing, Nature communications, pp. 1-12, Jul. 24, 2014.
Tsymbal et al., Tunneling across a ferroelectric, Science, issue 5784 (Jul. 14, 2006), pp. 181-183.
Yamada et al, Giant Electroresistance of Super-tetragonal BiFeO3-Based Ferroelectric Tunnel Junctions, ACSNANO, vol. 7, No. 6, pp. 5386-5390, 2013.
Garcia et al., Giant Tunnel electroresistance for non-destructive readout of ferroelectric States, Nature, vol. 460, pp. 81-84, Jul. 2, 2009.
Park et al., Effect of forming gas annealing on the ferroelectric properties of Hf0,5Zr0,5O2 thin films with and without Pt electrodes, Applied Physics Letters, vol. 102, Mar. 22, 2013.
Cho et al., Structural properties and electronic structure of HfO2-ZrO2 composite films, Physical Review B82, Sep. 13, 2010.
Muller et al., Ferroelectricity in Simple Binary ZrO2 and HfO2, ACS Publications, American Chemical Society, 12, pp. 4318-4323, 2012.
Muller et al., Ferroelectric Zr0,5Hf0,5O2 thin films for nonvoatile memory applications, Applied Physics Letters, 99, Sep. 19, 2011.
Park et al., Evolution of Phases and ferroelectric properties of thin Hf0,5Zr0,5O2 films according to the thickness and annealing temperature, Applied Physics Letters, 102, Jun. 18, 2013.
Park et al., The effects of crystallographic orientation and strain of thin Hf0,5Zr0,5O2 film on its ferroeelectricity, Applied Physics Letters, 104, Feb. 18, 2014.
Zenkevich et al., Elctronic band alignment and electron transport in CR/BATiO3/Pt ferroelectric tunnel junctions, Applied Physics Letters, 102, Feb. 14, 2013.
Gruverman et al., Tunneling Electroresistance Effect in Ferroelectric Tunnel Junctions at the Nanoscale, American Chemical Society, Nano Lett. vol. 9., No. 10, 2009.
Lu et al., Current-voltage characteristics and On/Off ratio in ferroelectric tunnel junctions, Journal of Applied Physics, vol. 112, 2012.
Chernikova et al., Ultrathin Hf0.5Zr0.5O2 Ferroelectric Films on Si, Applied Materials & Interfaces, 8, pp. 7232-7237, 2016.
Scott et al., Oxygen-vacancy ordering as a fatigue mechanism in perovskite ferrelectrics, Applied Physics Letter, vol. 76, pp. 3801-3803, 2000.
Brinkman et al., tunneling Conductance of Asymmetrical Barnes, Journal of Applied Physics, 41, Oct. 21, 1969.
Soni et al., Giant electrode effect on tunneling electroresistance in ferroelectric tunnel junctions, Nature Communications, p. 1-10, Nov. 17, 2014.
Rodenbucher, Cluster-like resistive switching of SrTiO3:Nb surface layers, New Journal of Physics, vol. 15, 2013.
Lu et al. ,Ferroelectric tunnel junctions with graphene electrodes, Nature communications, pp. 1-7,2014.
Junwoo, Son et al., Epitaxial SrTiO3 Tunnel Barriers on Pt/MgO Substrates, The Japan Society of Applied Physics, Applied Physics Express 1 (2008) 061603.
Vargas, F.A., et al., On-axis radio frequency magnetron sputtering of stoichiometric BaTiO3 target: Localized re-sputtering and substrate etching during thin film growth, ., Thin Solid Films (2015), http://dx.doi.org/10.1016/j.tsf.2015.07.065.

\* cited by examiner

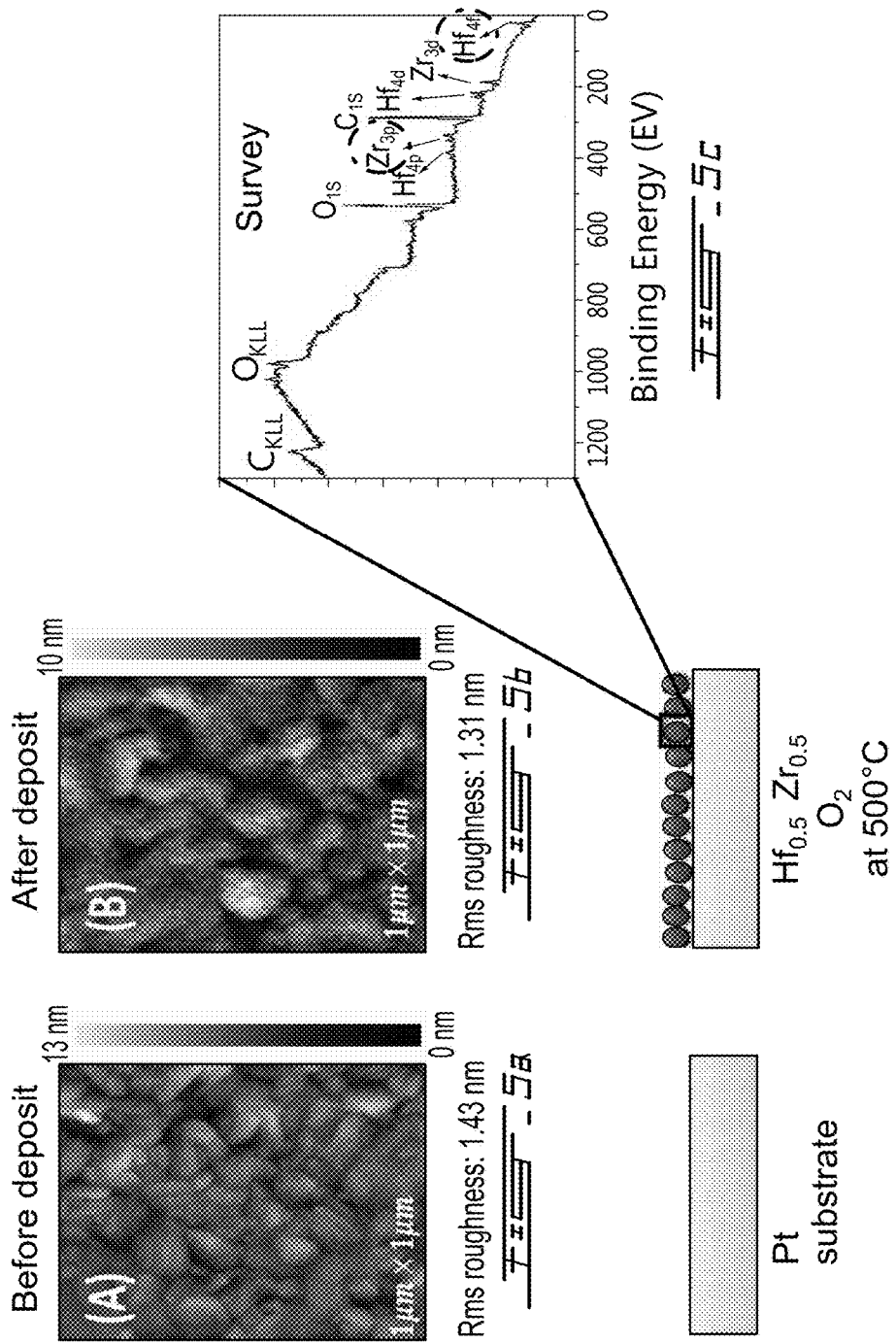

FERROELECTRIC TUNNEL JUNCTION AND METHOD OF FABRICATION THEREOF

FIELD OF THE INVENTION

The present invention relates to ferroelectric tunnel junctions. More specifically, the present invention is concerned with hafnium zirconium-based ferroelectric tunnel junctions and a method of fabrication thereof.

BACKGROUND OF THE INVENTION

Semiconductor memories, which are key components of any electronic device[1], can be classified either into random access memories (RAM) or read-only memories (ROM)[2], as shown in FIG. 1 for example.

In random access memories (RAMs), information can be written or read from any cells multiple times[2]. Random access memories (RAMs) can be further classified based on the retention of the stored information, into volatile memories (Dynamic RAMs (DRAMs) and static RAMs (SRAMs)) and nonvolatile memories[2].

Dynamic RAMs (DRAMs) have been a technology of choice for the past four decades[3]. Nowadays semiconductor memories represent 21% of the total semiconductor market, and although a large variety of memory types is available, the market is dominated mainly by dynamic RAMs (DRAMs), which make up 48% of the memory market, as shown in FIG. 2. However, dynamic RAMs (DRAMs) have gradually reached their physical scalability limit and data retention time is limited by leakage of the capacitor and the transistor. Another drawback is related to poor energy efficiency, as 40% of the overall power consumption is originated from the system memory power, i.e. DRAM power, and the disk power. Also, high density dynamic RAM technologies have reached its miniaturization limit with lateral feature size of DRAMs memories shrunk down to about 14 $nm^2$.

Emerging contenders for DRAMs seek to address the above concerns, by being non-volatile and scalable to smaller dimensions, for example by using ferroelectric tunnel junction memory (FTJ)[4].

A ferroelectric tunnel junction memory consists of two metal electrodes separated by a nanometer-thick ferroelectric layer.[4] The tunneling electroresistance effect (TER) occurring in this semiconductor memory predominantly relies on the modulation of the electrostatic potential profile by polarization reversal of an ultrathin ferroelectric barrier, which produces two different electrical resistance states in the ferroelectric tunnel junction, which can be codified as "ON" and "OFF" in a binary code. The use of the tunneling electroresistance effect in a semiconductor memory brings a number of advantages such as for example: i) high fatigue resistance (endurance ~$10^6$ cycles), ii) high speed ("ON/OFF" states can be written with pulses down to 10 ns), iii) high scalability, and iv) simple architecture[4,5].

A key challenge to overcome in a ferroelectric tunnel junction memory is to find an adequate material which, in ultrathin film form, i.e. with a thickness below about 4 nm, presents ferroelectric properties. In addition, this ferroelectric material should present synthesis parameters compatible with complementary metal oxide semiconductor processes (CMOS)[4], in terms in particular of chemical compatibility and crystallization temperature. Current ferroelectric tunnel junction devices are based on perovskite ferroelectric barriers[6], which suffer from lack of CMOS compatibility due to poor interfacing with silicon, an elevated crystallization temperature, and electrical degradation under forming gas treatment. These issues, along with the inability to further scale down, prevent their use in high density memories[7,8].

There is still a need in the art for ferroelectric tunnel junctions and a method of fabrication thereof.

The present description refers to a number of documents, the content of which is herein incorporated by reference in their entirety.

SUMMARY OF THE INVENTION

More specifically, in accordance with the present invention, there is provided a method for fabricating a ferroelectric tunnel junction, comprising growing a hafnium zirconium oxide film barrier layer by sputtering in the presence of oxygen at a temperature of at most 425° C., on a conductive material as a bottom electrode, and depositing a conductive material as a top electrode.

There is further provided a ferroelectric tunnel junction comprising a hafnium zirconium oxide film of a thickness of at most 5 nanometers, fabricated by growing a hafnium zirconium oxide film barrier layer by sputtering in the presence of oxygen at a temperature of at most 425° C., on a conductive material as a bottom electrode, and depositing a conductive material as a top electrode.

There is further provided a memory device comprising a ferroelectric tunnel junction comprising a hafnium zirconium oxide film of a thickness of at most 5 nanometers, fabricated by growing a hafnium zirconium oxide film barrier layer by sputtering in the presence of oxygen at a temperature of at most 425° C., on a conductive material as a bottom electrode, and depositing a conductive material as a top electrode.

Other objects, advantages and features of the present invention will become more apparent upon reading of the following non-restrictive description of specific embodiments thereof, given by way of example only with reference to the accompanying drawings.

BRIEF DESCRIPTION OF THE DRAWINGS

In the appended drawings:

FIG. 5C shows a XPS spectrum of a $Hf_{0.5}Zr_{0.5}O_2$ film;

FIG. 5D shows a $Hf_4f$ detail of the XPS spectrum of FIG. 5C, where the bottom line corresponds to a background curve based on the Shirley method;

FIG. 5E shows a $Zr_3d$ detail of the XPS spectrum of FIG. 5C, where the bottom line corresponds to a background curve based on the Shirley method;

DESCRIPTION OF ILLUSTRATIVE EMBODIMENTS

The present invention is illustrated in further details by the following non-limiting examples.

Two different ferroelectric tunnel junction devices using ferroelectric ultrathin hafnium zirconium oxide films, i.e. of a thickness of at most 5 nanometers, were fabricated. A first one comprises two Pt electrodes separated by a Hf$_{0.5}$Zr$_{0.5}$O$_2$ layer, i.e. Pt/Hf$_{0.5}$Zr$_{0.5}$O$_2$/Pt and a second comprises a TiN electrode, Hf$_{0.5}$Zr$_{0.5}$O$_2$, and a Pt electrode, i.e. TiN/Hf$_{0.5}$Zr$_{0.5}$O$_2$/Pt.

Figure 1:
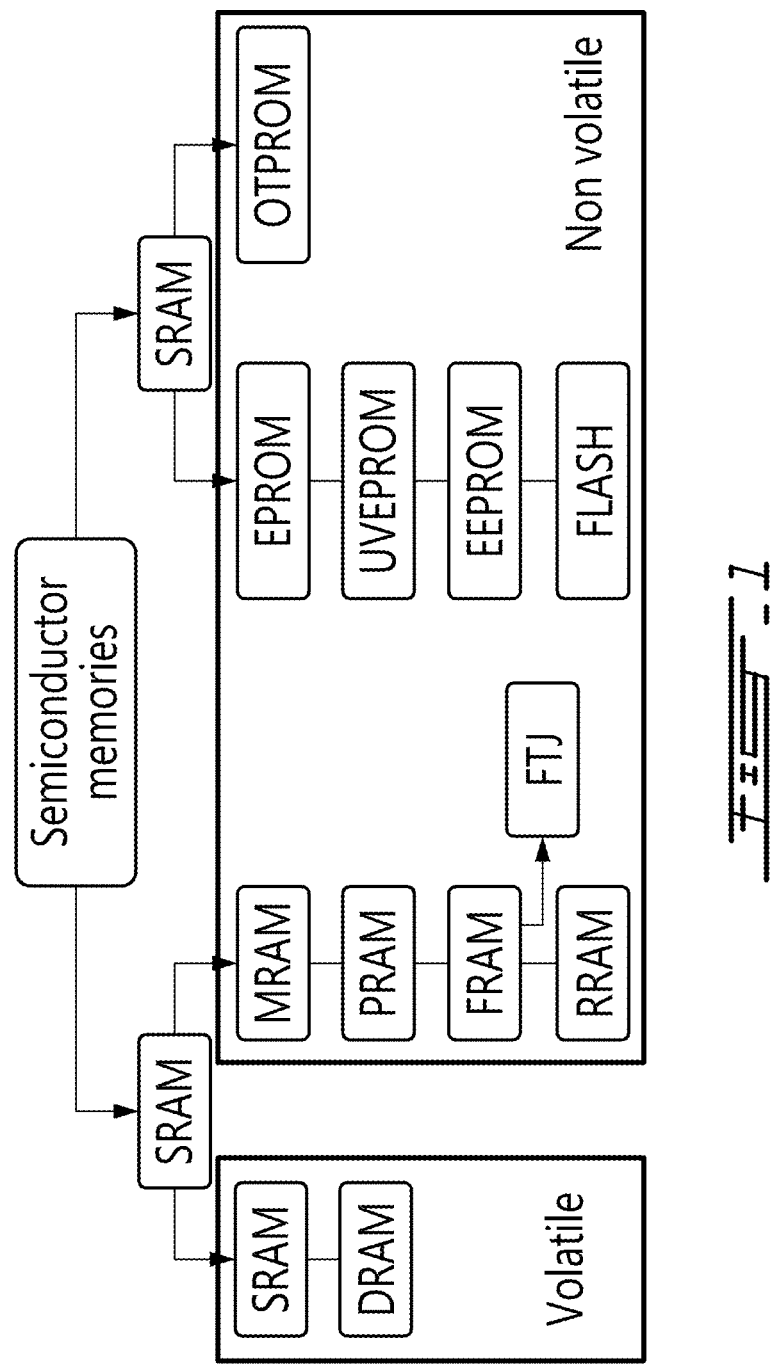
FIG. 1 is a schematic view of semiconductor memories classification as known in the art.
Figure 2:
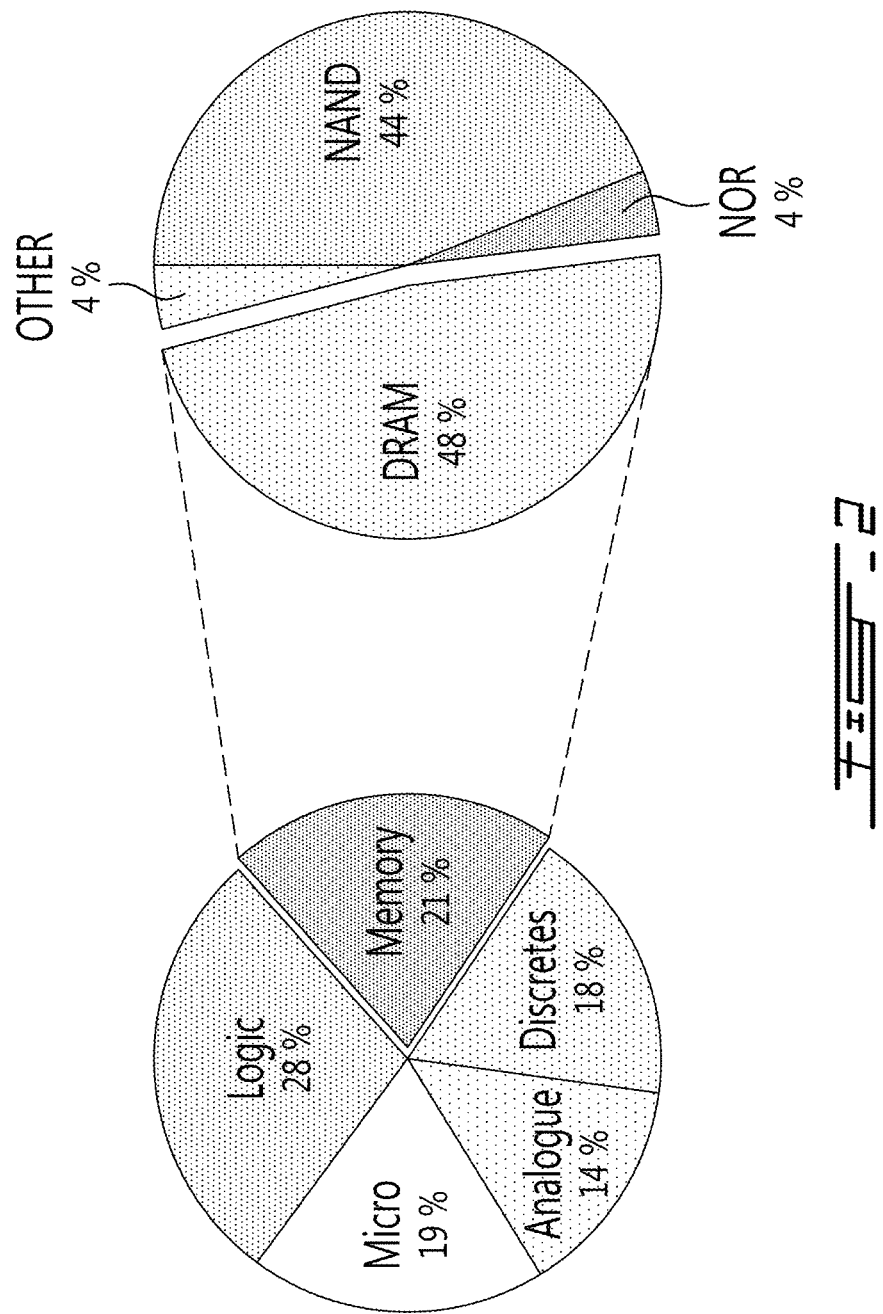
FIG. 2 is a schematic view of semiconductor memory market as known in the art (source: WSTS Q1 2013)
Figure 3:
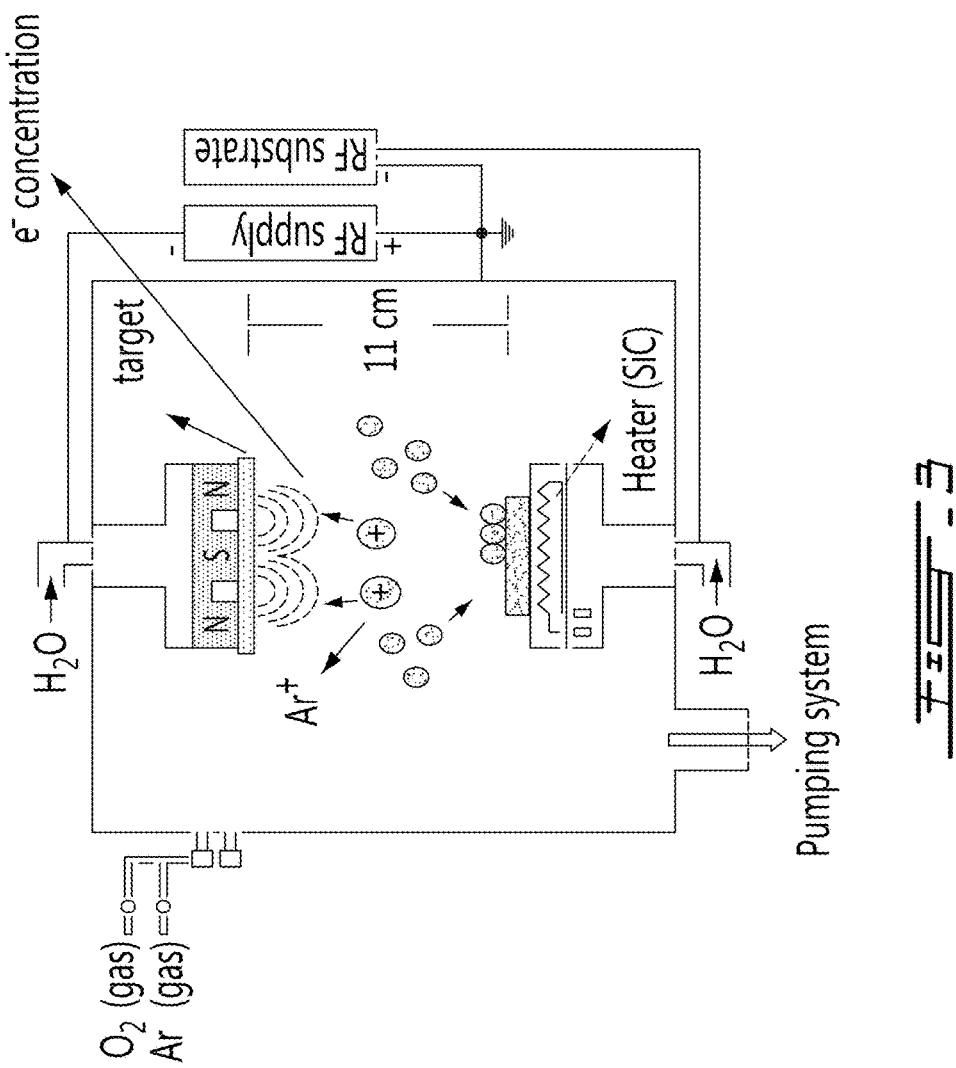
FIG. 3 is a schematic view of a RF-sputtering system used according to an embodiment of an aspect of the present invention.

For the TiN/Hf$_{0.5}$Zr$_{0.5}$O$_2$/Pt ferroelectric tunnel junction device, a Hf$_{0.5}$Zr$_{0.5}$O$_2$/TiN layer was grown by radio frequency sputtering on (100) p-type Si. The titanium nitrite (TiN) bottom electrode was deposited on (100) p-type Si substrates by on-axis radio frequency magnetron sputtering at 400° C. in a Ar and N$_2$ atmosphere under a sputtering pressure of 10 mTorr (see FIG. 3). The subsequent growth of Hf$_{0.5}$Zr$_{0.5}$O$_2$ was performed at 425° C. During this step, the sputtering medium consisted of Ar and O$_2$ and the RF power on the one inch in diameter of polycrystalline Hf$_{0.5}$Zr$_{0.5}$O$_2$ target was fixed at 20 W. In both cases, the sputtering chamber was pumped prior to deposition to a base pressure of about 10-5 Torr using a dry pumping station. To eliminate contaminations and to maintain the target composition homogeneous, the target surface was cleaned for 15 min by presputtering prior to all depositions.

For the Pt/Hf$_{0.5}$Zr$_{0.5}$O$_2$/Pt ferroelectric tunnel junction device, a high quality Hf$_{0.5}$Zr$_{0.5}$O$_2$ layer was deposited on a (111)-oriented polycrystalline Pt substrate. Before deposition, the substrate was ultrasonically rinsed with acetone and methanol, followed by annealing at 650° C. to stabilize the Pt microstructure. The Pt/Hf$_{0.5}$Zr$_{0.5}$O$_2$(2.8 nm) heterostructure was grown via on-axis radio-frequency (RF) magnetron sputtering at 450° C., using a deposition pressure of 5 mTorr (2 sccm O$_2$ and 2 sccm Ar) for an RF power of 20 Watts on a 1-inch target.

The sputtering conditions are listed in Table 1 below, using a computer controlled table top deposition device equipped with three magnetron sputter guns at the top and a heated substrate holder block at the bottom along the axis of the sputter-guns, the cylindrical chamber having a length of 18" and a diameter of 8", was used (SPT310, Plasmionique Inc.).

TABLE 1

| | Film: | | |
|---|---|---|---|
| | TiN | Hf$_{0.5}$Zr$_{0.5}$O$_2$ | Hf$_{0.5}$Zr$_{0.5}$O$_2$ |
| Substrate: | (100) p-type Si | TiN/(100) p-type Si | polycrystalline Pt |
| Power density: | ~4 W/cm$^2$ | ~4 W/cm$^2$ | ~4 W/cm$^2$ |
| Target-substrate spacing: | 11 cm | 11 cm | 11 cm |
| Sputtering medium:[2] | Ar and N$_2$ mixture[3] | Ar and O$_2$ mixture[4] | Ar and O$_2$ mixture[4] |
| Sputtering pressure: | 10 mTorr | 5 mTorr | 5 mTorr |
| Substrate temperature: | 400° C. | 425° C. | 425° C. |
| Pre-sputtering duration: | 15 min | 15 min | 15 min |

[1]Target dimensions: 2.54 cm in diameter; 0.317 cm in thickness
[2]Gass purity: Argon (99.998% pure), Nitrogen (99.998%) and Oxygen (99.993%)
[3]Nitrogen partial pressure: P$_N$ = N$_2$/(Ar + N$_2$) = 70%
[4]Oxygen partial pressure: P$_O$ = O$_2$/(Ar + O$_2$) = 50%
Targets: TiN ceramic disc (99.9% pure) and Hf$_{0.5}$Zr$_{0.5}$O$_2$ ceramic disc (99.9% pure)

Figure 4:
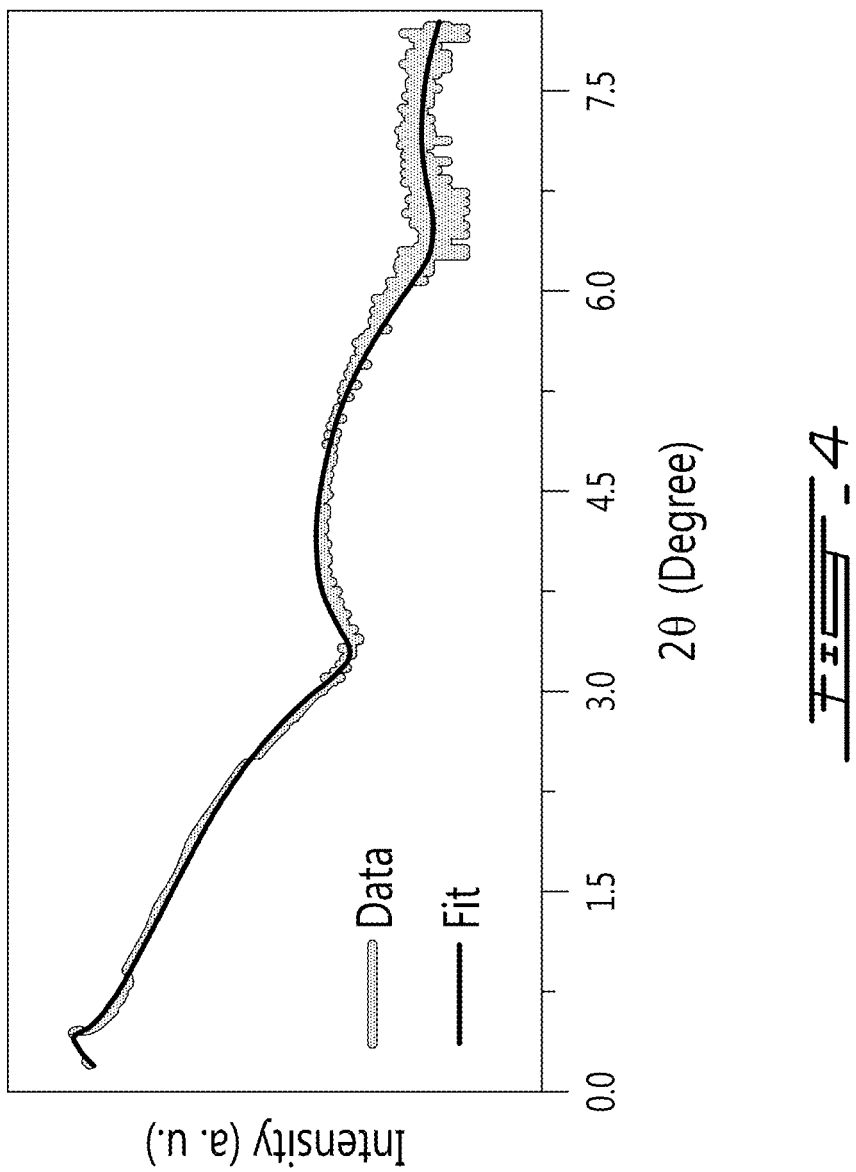
FIG. 4 show an XRR spectrum recorded on a $Hf_{0.5}Zr_{0.5}O_2$ film (black curve and fit curve in stippled lines)

The layer thickness of the ferroelectric film was determined by X-ray reflectivity (XRR) (Philips X'Pert Materials Research Diffractometer). The layer thickness was found to be 2.8 nm for the film used in the fabrication of the ferroelectric tunnel junction (FIG. 4).

Figure 5A:
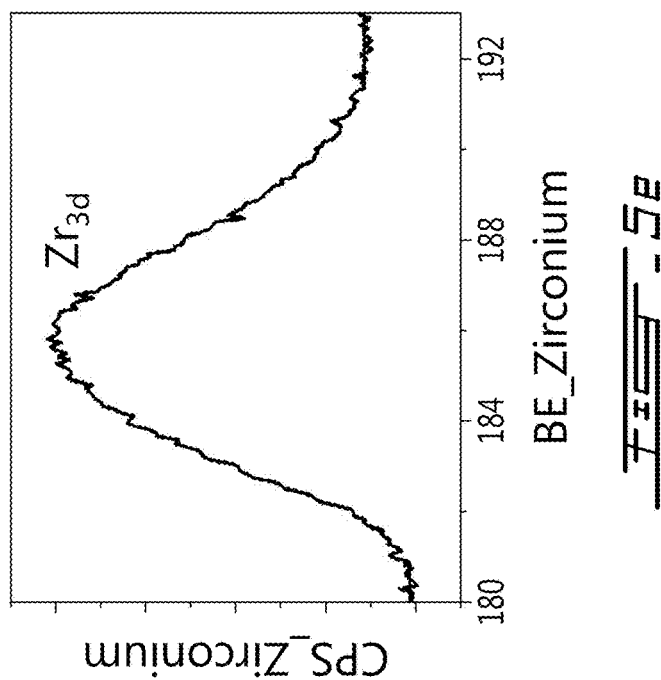
FIG. 5A shows Rms image before deposition.

Analysis by X-ray photoelectron spectroscopy (FIG. 5C) revealed the presence of Zr, Hf, O, and C (contaminant) at the film surface. In order to determine the elemental composition of the films, additional high resolution scans were performed in selected binding energy ranges for Hf$_{4f}$ (FIG. 5D) and Zr$_{3d}$ (FIG. 5E). Relative atomic concentrations were determined from the peak areas and the relative sensitivity factors of peak position revealed a stoichiometric deposition, i.e. a Hf/Zr ratio of about 1, with the synthesis parameters listed in Table 1.

Polarization switching of 2.8 nm-thick films was investigated by piezoresponse force microscopy (PFM). The piezoresponse was obtained by applying an AC voltage between the electrodes (Pt or TiN) with a frequency of 51 kHz, off-resonance.

Figure 6B:
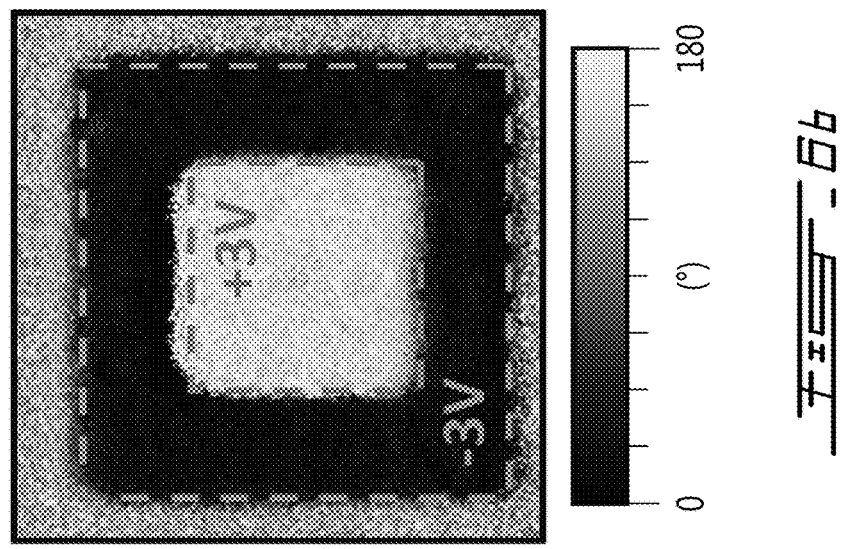
FIG. 6B is a PFM phase image of $Hf_{0.5}Zr_{0.5}O_2$ films.
Figure 6A:
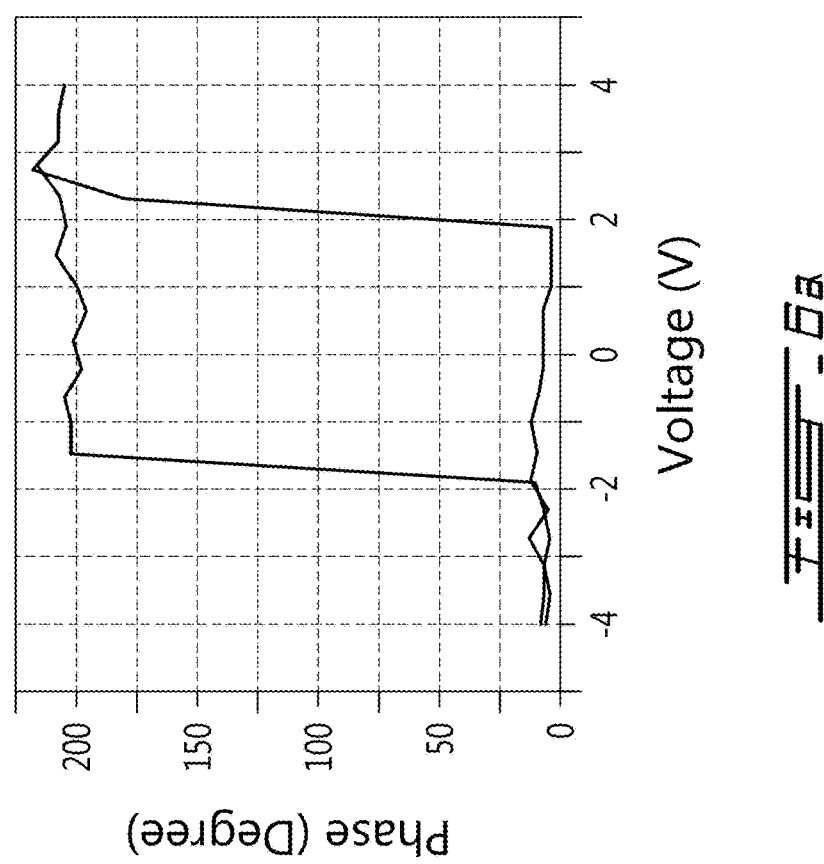
FIG. 6A shows the local piezo-response force microscopy (PRF) phase.

In the case of local hysteresis measurements, various DC voltages were applied in sequence, starting from maximum negative to maximum positive, and then back with a voltage interval between steps, while simultaneously monitoring the amplitude and phase of the piezoresponse. In general, Hf$_{0.5}$Zr$_{0.5}$O$_2$ films grown at a temperature above 425° C. showed typical hysteresis curves, which indicated the ferroelectric character of the material (FIG. 6A). A square region (2 µm×2 µm) of such a film was switched upwards by scanning the film surface with a tip biased with a negative voltage ($V_{Tip}$=−V) exceeding the coercive voltage of the film. Then, polarization within an area of 1 µm×1 µm in the center was switched downwards by applying a positive bias ($V_{Tip}$=+V). Films grown at 425° C. were able to go through a full cycle of ferroelectric polarization switching (FIG. 6B). Overall, the ferroelectric phase of $Hf_{0.5}Zr_{0.5}O_2$ occurred at a synthesis temperature of about 4250° C., which is lower than the synthesis temperature for conventional perovskite materials (above 600° C.)[7,11]. In terms of device application, this is an advantage for CMOS compatibility because of the relative low thermal energy required for $Hf_{0.5}Zr_{0.5}O_2$ formation. Deposition temperatures below 425 degrees Celsius, as long as they do not compromise the electronic properties, are advantageous in terms of process compatibility.

To confirm that the electric switching observed by C-AFM is due to the tunneling electroresistance effect rather than another resistive switching mechanism, the experimental data were fitted with two different theoretical models.

For the case of the $TiN/Hf_{0.5}Zr_{0.5}O_2/Pt$ ferroelectric tunnel junction device, the Brinkman model was employed, which predicts direct tunneling current across asymmetric barriers, i.e. ferroelectric tunnel junction devices where the material of the top and bottom electrodes are different. This model determines the tunneling current density (J) as a function of voltage (V), using the potential barrier steps at both ferroelectric-electrode interfaces ($\varphi_1$ and $\varphi_2$), layer thickness (d), electron charge (e) and the effective electron mass (m) as described by relation (1) below:

$$J = -\left(\frac{4em}{9\pi^2 h^3}\right) \frac{\exp[\alpha(V)]\left[\left(\varphi_2 - \frac{eV}{2}\right)^{\frac{3}{2}} - \left(\varphi_1 + \frac{eV}{2}\right)^{\frac{3}{2}}\right]1}{\alpha^2(V)\left[\left(\varphi_2 - \frac{eV}{2}\right)^{\frac{1}{2}} - \left(\varphi_1 + \frac{eV}{2}\right)^{\frac{1}{2}}\right]^2} \times \sinh\left\{\frac{3}{2}\alpha(V)\left[\left(\varphi_2 - \frac{eV}{2}\right)^{\frac{1}{2}} - \left(\varphi_1 + \frac{eV}{2}\right)^{\frac{1}{2}}\right]\frac{eV}{2}\right\}, \quad (1)$$

where $\alpha(v) = [4d(2m)^{1/2}]/[3h(\varphi_1 + eV - \varphi_2)]$ and h is the reduced Planck constant. The input parameters used to fit the downward and upward states of the current-voltage curve are listed in Table 2 below.

TABLE 2

|  | ON state | OFF state |
| --- | --- | --- |
| Barrier height 1 ($\varphi_1$)[1] | 1.86 eV | 2.75 eV |
| Barrier height 2 ($\varphi_2$)[1] | 2.36 eV | 2.20 eV |
| Layer thickness (d) | 3 × 10⁻⁹ m | |
| Electron mass (m) | 9.1094 × 10⁻³¹ Kg | |
| Electron charge (e) | 1.60217662 × 10⁻¹⁹ C | |
| Planck constant (h) | 1.054571800 × 10⁻³⁴ J · s | |

[1]eV units of both potential barriers were converted to Joules (J)

On the other hand the I-V curve of the $Pt/Hf_{0.5}Zr_{0.5}O_2/Pt$ ferroelectric tunnel junction device was fitted using the Simmons model as per relation 2 below, which considers the tunneling current density (J) across symmetric barriers, i.e. ferroelectric tunnel junction devices where the material of both electrodes are similar. The parameters values used to fit the downward and upward state are listed in Table 3 below.

$$J = \left[\frac{3(2m\varphi)^{\frac{1}{2}}}{2s}\right]\left(\frac{e}{h}\right)^2 V \times \exp\left[\frac{-(4\pi s)}{h}(2m\varphi)^{\frac{1}{2}}\right] \quad (2)$$

TABLE 3

|  | ON state | OFF state |
| --- | --- | --- |
| Barrier height 1 ($\varphi_1$)[1] | 2.33 eV | 2.67 eV |
| Layer thickness (d) | 2.8 nm | |
| Electron mass (m) | 9.1094 × 10⁻³¹ Kg | |
| Electron charge (e) | 1.60217662 × 10⁻¹⁹ C | |
| Reduced planck constant (h) | 1.626070040 × 10⁻³⁴ J · s | |

[1]eV units of both potential barriers were converted to Joules (J)

As can be seen from the I-V curves of FIG. 7, there is a good agreement between the theoretical and experimental data in both ferroelectric tunnel junction devices, attesting to the presence of direct tunneling current across the ferroelectric barrier. The ferroelectric tunnel junction devices present a tunneling electroresistance ratio equal to 15 and 20 for the $TiN/Hf_{0.5}Zr_{0.5}O_2/Pt$ and $Pt/Hf_{0.5}Zr_{0.5}O_2/Pt$ heterostructures, respectively, which are in the range of the values typically reported for ferroelectric tunnel junctions[4].

Figure 7A:
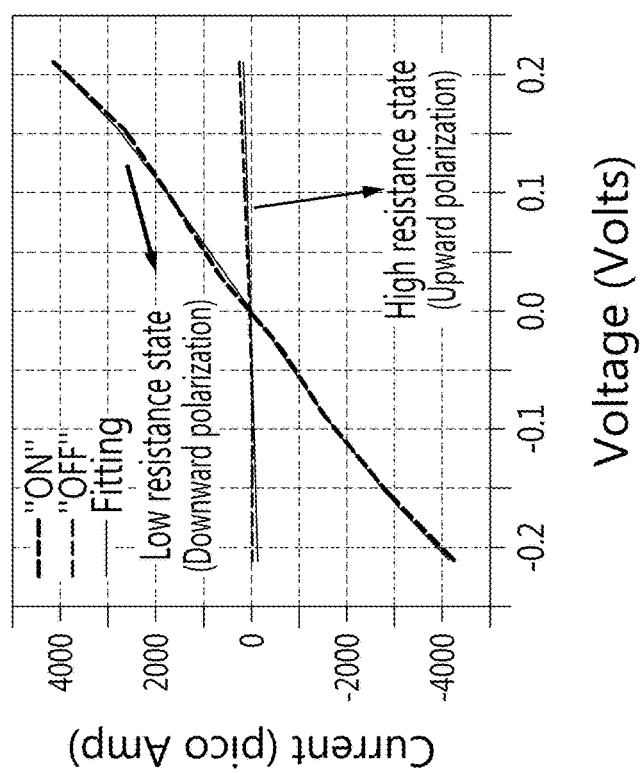
FIG. 7A shows an I-V curve measured on a TiN/$Hf_{0.5}Zr_{0.5}O_2$/Pt heterostructure.
Figure 7B:
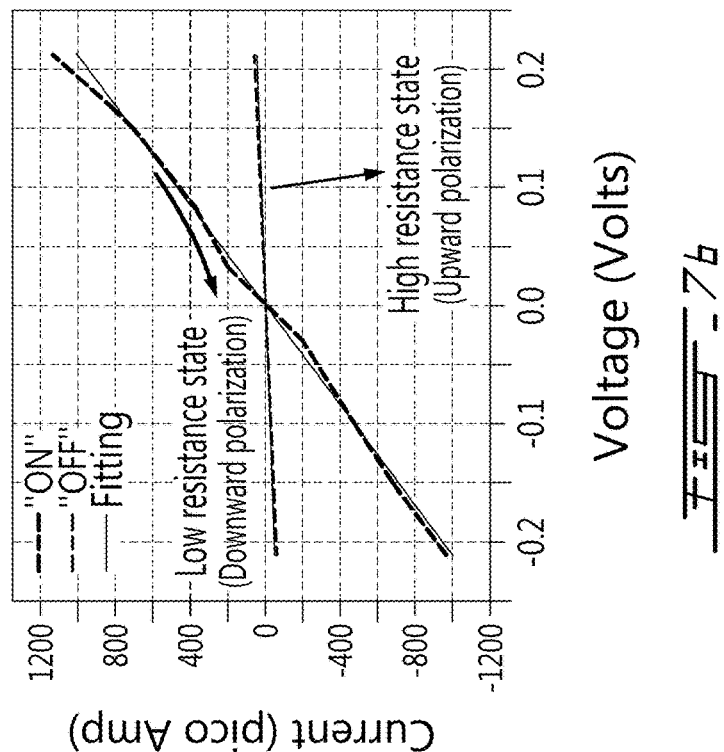
FIG. 7B shows an I-V curve measured on a Pt/$Hf_{0.5}Zr_{0.5}O_2$/Pt heterostructure.

Thus, ferroelectric tunnel junctions were fabricated by covering the 2.8 nm-thick $Hf_{0.5}Zr_{0.5}O_2$ films deposited on conductive substrates, either TiN or Pt as bottom electrodes, with Pt top electrodes. The resulting ferroelectric tunnel junction devices were characterized by their hysteretic I-V curve. Voltage sweeps were applied to the top electrode via a conductive AFM tip. Typical I-V curves are shown in FIGS. 7A and 7B. In both cases the I-V curve displays a hysteretic behavior characterized by two different resistance states: an initial high-resistance state (upward polarization) and a low-resistance state (downward polarization). The existence of two clearly defined resistance states suggests a tunneling electroresistance effect. Asymmetric electrodes may be advantageous for device operation though not imperative.

To prevent the loss of oxygen by exchange with the ambient atmosphere, which may contribute to fatigue of ferroelectric thin films under repetitive switching, expressed as loss of reversible remnant polarization, oxygen-based electrode materials, such as iridium/iridium oxide for example, may be used [17].

Figure 8:
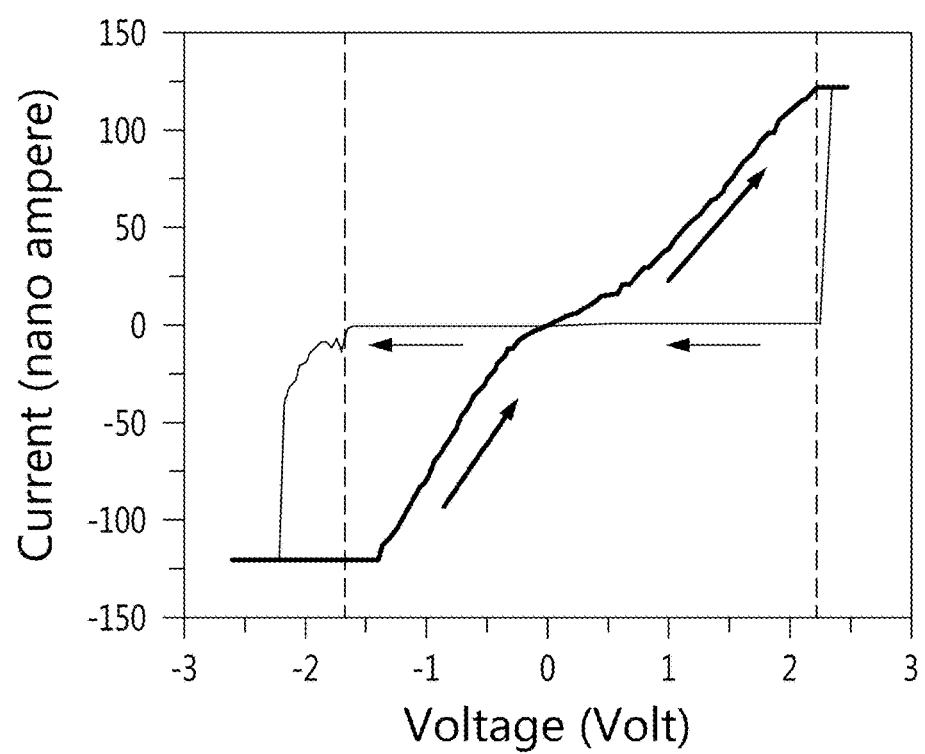
FIG. 8 shows I-V curve measured on a TiN/Hf$_{0.5}$Zr$_{0.5}$O$_2$/Pt (300 μm in diameter) heterostructure, the direction of the voltage sweeps being given by the arrows.
Figures 9A, 9B:
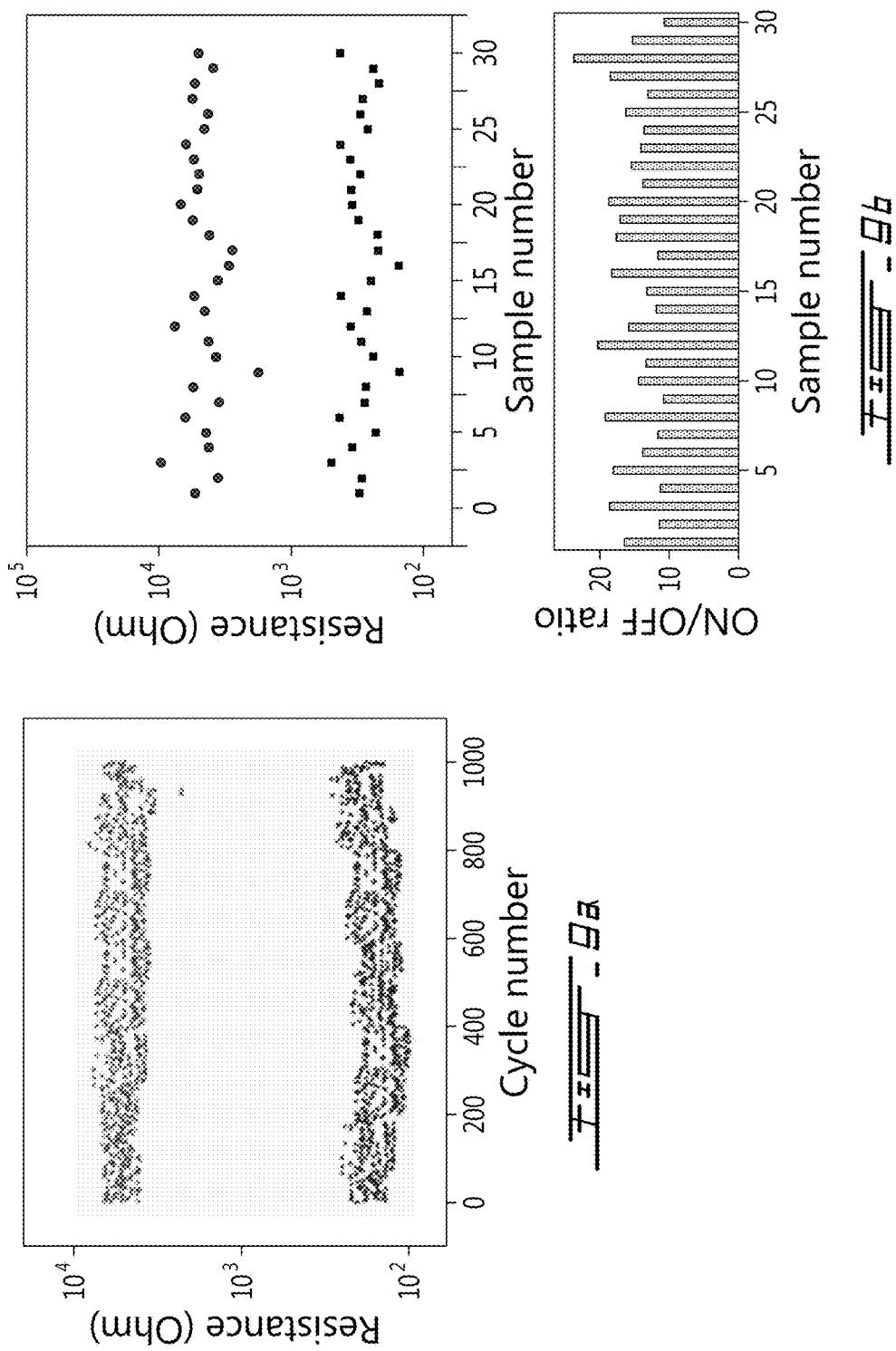
FIG. 9A shows fatigue measurements on a TiN/Hf$_{0.5}$Zr$_{0.5}$O$_2$/Pt (diameter of 300 μm) heterostructure displaying the "OFF" and "ON" (in bold) resistance values over 1000 write/read cycles.
FIG. 9B shows "ON" and "OFF" resistances state (upper panel) and ON/OFF ratios (bottom panel) of 30 different FTJ memory cells.
Figure 9C:
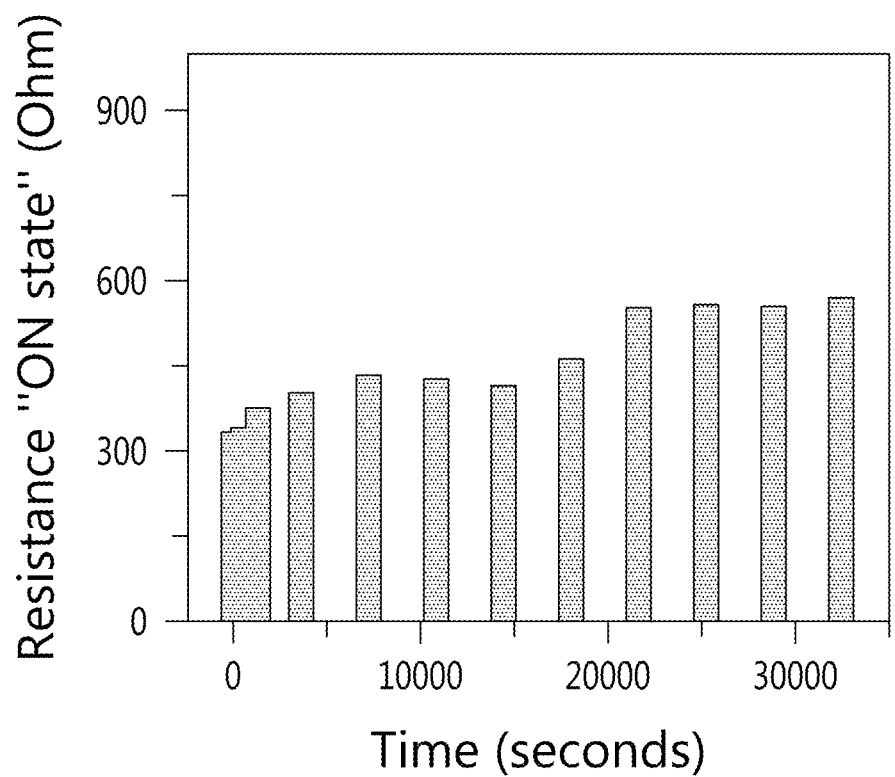
FIG. 9C shows Retention properties, where the "ON" resistance state was measured as a function of time at a read voltage of 0.4 V.

For devices of 300 µm in diameter (the size of the Pt electrode), the I-V curve illustrated in FIG. 8 shows a change from the "ON" state to the "OFF" state at a write voltage of +2.2 V while the change from "OFF" state to "ON" state takes place at a write voltage of −1.7 V. The endurance of the $TiN/Hf_{0.5}Zr_{0.5}O_2/Pt$ heterostructure was evaluated by recording 1000 I-V cycles under quasi-static conditions on the same FTJ memory cell. Given that contact by the AFM was required, the acquisition speed was limited by the AFM specifications and a 1000 cycle quasi-static measurement already took a day. For each I-V curve, the "ON" and OFF" resistances were obtained at a read voltage of +0.2 V (FIG. 9A). They remain stable over 1000 cycles, indicating good endurance of the FTJs. The reproducibility of the TER effect in the FTJs under study was investigated by recording I-V cycles from 30 different FTJ devices. For each memory cell, the resistance values for both the "ON" and "OFF" states were recorded at 0.2V. The 30 memories cells presented an ON/OFF ratio, or TER ratio, of 15+3 on average (FIG. 9B). This result attests to the high reproducibility of the TER effect in the $TiN/Hf_{0.5}Zr_{0.5}O_2/Pt$ FTJ memory devices. The retention properties of the present FTJ were evaluated on a single memory cell by recording the "ON" resistance state value over time at a read voltage of +0.4 V [16]. As shown in FIG. 9C, the "ON" resistance state can still be read after 8 h, demonstrating that the FTJ devices present a long time retention.

There is thus provided a method for fabrication of a ferroelectric tunnel junction based on a CMOS compatible tunnel barrier ($Hf_{0.5}Zr_{0.5}O_2$) on an equally CMOS compatible electrode. A tunnel electroresistance (TER) effect was observed (resistance change equal to two orders of magnitude) with an ON/OFF ratio of 15 and 20 (measured at 0.2 V) for $TiN/Hf_{0.5}Zr_{0.5}O_2/Pt$ and $Pt/Hf_{0.5}Zr_{0.5}O_2/Pt$ ferroelectric tunnel junctions, respectively, for example. These CMOS compatible ferroelectric tunnel junctions based on hafnium zirconium oxide tunnel barriers may be used to replace current dynamic random access memories (DRAMs).

Doping with ions that reinforce the polarization without detriment to the insulating properties of the barrier layer may be advantageous for the device performance.

Figure 5B:
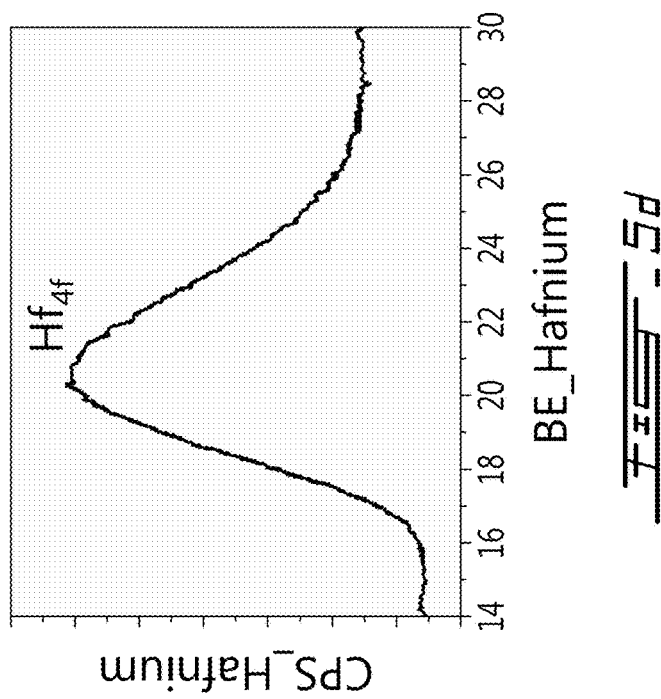
FIG. 5B shows Rms image after deposition.

The junction operation was found to be stable regarding variations of the Hf/Zr ratio from the 50:50 distribution of Hf to Zr (as described above in relation to FIG. 5, t XPS analysis show $Hf_xZr_{(1-x)}O_2$, with x almost 0.5) in the barrier layer, as well as regarding isovalent co-doping. The polycrystalline nature of the barrier materials and the electrodes is compatible with device operation. The presence of additional crystalline phases other than the ferroelectric phase of the barrier material is compatible with device operation. RF magnetron sputtering offers the particular advantages of a single deposition process for electrodes and barrier and the absence of chemical contaminants as commonly encountered in atomic layer deposition, chemical solution deposition metalorganic chemical solution deposition. These contaminations are a source of extrinsic defects that are detrimental to the electronic properties of the barrier layer.

The electrodes may be metallic or semiconducting electrodes, of a thickness selected so as to guarantee metallic or good semiconducting conduction, i.e. typically several tens of nanometers, for example in a range between monolayers and 100 nanometers. They may be metallic, TiN, Au, Pt, graphene; semiconducting electrodes may be selected, such as Niobium-doped strontium titanate (SrTiO3:Nb). Oxygen-containing electrodes may be used. Indeed, the present junctions may be used for overcoming current ferroelectric random access memories (Fe-RAM). Electrode materials known to limit fatigue in ferroelectric random access memory (FeRAM), provided that their deposition is CMOS compatible, such as $Ir/IrO_2$ may be used.

The present junctions are intended for pulse operation, while quasi-static experiments were merely used for characterisation. As people in the art will appreciate, exact operating conditions are subject to the choice of e.g. peripheral circuitry and pulse length.

Operation as a non-volatile memory device also occurs under different charge transport mechanisms other than direct tunnelling. This applies in particular to Fowler-Nordheim tunnelling and thermionic charge transport.

There is thus provided a method for fabricating hafnium zirconium oxide-based ferroelectric tunnel junction devices, comprising depositing hafnium zirconium oxide by sputtering in the presence of oxygen at a temperature of at most 425° C. on a conductive material as a bottom electrode, and depositing a conductive material as a top electrode. Sputtering prevents the formation of extrinsic defects such as in particular unwanted dopants with a different valence state than the ions in the crystal, which would lead to unwanted donor or acceptor doping and subsequent conductivity that would cancel tunnel contact. Also, sputtering, as compared to pulsed laser deposition, is suitable for large surface coverage as required in industrial processes. Moreover, the sputter deposition is performed at moderate temperatures, which allows maintaining the stability of CMOS structures.

The scope of the claims should not be limited by the preferred embodiments set forth in the examples, but should be given the broadest interpretation consistent with the description as a whole.

REFERENCES

1 Livio Baldi, Roberto Bez, and Gurtej Sandhu, Solid-State Electronics 102, 2 (2014).
2 D. S. Jeong, R. Thomas, R. S. Katiyar, J. F. Scott, H. Kohlstedt, A. Petraru, and C. S. Hwang, Rep Prog Phys 75 (7), 076502 (2012).
3 A. Makarov, V. Sverdlov, and S. Selberherr, Microelectronics Reliability 52 (4), 628 (2012).
4 V. Garcia and M. Bibes, Nat Commun 5, 4289 (2014).
5 E. Y. Tsymbal and H. Kohlstedt, Science 313 (5784), 181 (2006).
6 Hiroyuki Yamada, Vincent Garcia, Stephane Fusil, Soren Boyn, Maya Marinova, Alexandre Gloter, Stephane Xavier, Julie Grollier, Eric Jacquet, Cecile Carretero, Cyrile Deranlot, Manuel Bibes, and Agnes Barthelemy, American Chemical Society NANO 7, 5385 (2013); V. Garcia, S. Fusil, K. Bouzehouane, S. Enouz-Vedrenne, N. D. Mathur, A. Barthelemy, and M. Bibes, Nature 460 (7251), 81 (2009).
7 Min Hyuk Park, Han Joon Kim, Yu Jin Kim, Woongkyu Lee, Hyo Kyeom Kim, and Cheol Seong Hwang, Applied Physics Letters 102 (11), 112914 (2013).
8 Deok-Yong Cho, Hyung-Suk Jung, and Cheol Seong Hwang, Physical Review B 82 (9) (2010).
9 J. Muller, T. S. Boscke, U. Schroder, S. Mueller, D. Brauhaus, U. Bottger, L. Frey, and T. Mikolajick, Nano Lett 12 (8), 4318 (2012).
10 J. Muller, T. S. Boscke, D. Brauhaus, U. Schroder, U. Bottger, J. Sundqvist, P. Kucher, T. Mikolajick, and L. Frey, Applied Physics Letters 99 (11), 112901 (2011).
11 Min Hyuk Park, Han Joon Kim, Yu Jin Kim, Woongkyu Lee, Taehwan Moon, and Cheol Seong Hwang, Applied Physics Letters 102 (24), 242905 (2013); Min Hyuk Park, Han Joon Kim, Yu Jin Kim, Taehwan Moon, and Cheol Seong Hwang, Applied Physics Letters 104 (7), 072901 (2014).
12 A. Zenkevich, M. Minnekaev, Yu Matveyev, Yu Lebedinskii, K. Bulakh, A. Chouprik, A. Baturin, K. Maksimova, S. Thiess, and W. Drube, Applied Physics Letters 102 (6), 062907 (2013).
13 A. Gruverman, D. Wu, H. Lu, Y. Wang, H. W. Jang, C. M. Folkman, M. Ye. Zhuravlev, D. Felker, M. Rzchowski, C.-B. Eom, and E. Y. Tsymbal, Nano letters 9 (10), 3539 (2009).
14 Xiaoyan Lu, Hui Li, and Wenwu Cao, Journal of Applied Physics 112 (5), 054102 (2012).
15 A. Chernikova, M. Kozodaev, A. Markeev, D. Negrov, M. Spiridonov, S. Zarubin, O. Bak, P. Buragohain, H. Lu, E. Suvorova, A. Gruverman, and A. Zenkevich, ACS Appl Mater Interfaces 8 (11), 7232 (2016).
16 Abuwasib, M.; Lu, H.; Li, T.; Buragohain, P.; Lee, H.; Eom, C.-B.; Gruverman, A.; Singisetti, U. Scaling of Electroresistance Effect in Fully Integrated Ferroelectric Tunnel Junctions. Appl. Phys. Lett. 2016, 108 (15), 152904.

17 J. F. Scott and M. Dawber (Applied Physics Letters 76 (2000) 3801.

The invention claimed is:

1. A method for fabricating a ferroelectric tunnel junction, comprising growing a ferroelectric hafnium zirconium oxide film barrier layer by sputtering, in a 1:1 mixture of Ar and $O_2$ at a temperature of at most about 425° C. under a pressure of 5 mTorr, on a first conductive material as a bottom electrode, and depositing a second conductive material as a top electrode.

2. The method of claim 1, wherein the hafnium zirconium oxide film has a thickness of at most 5 nanometers.

3. The method of claim 1, wherein the hafnium zirconium oxide film is $Hf_xZr_{(1-x)}O_2$, with x about 0.5.

4. The method of claim 1, wherein the electrodes comprise ones of: a TiN, Au, Pt, graphene, Ir/$IrO_2$ and niobium-doped strontium titanate.

5. The method of claim 1, wherein the electrodes are oxygen-containing electrodes.

6. The method of claim 1, wherein comprising selecting electrodes of a thickness in a range between monolayers and 100 nanometers.

7. A ferroelectric tunnel junction, comprising a ferroelectric hafnium zirconium oxide film barrier layer between a bottom electrode and a top electrode, said hafnium zirconium oxide film barrier layer being grown by sputtering in a 1:1 mixture of Ar and $O_2$ at a temperature of at most about 425° C. on a conductive material as the bottom electrode, and said ferroelectric hafnium zirconium oxide film having a thickness of at most 5 nanometers; wherein said ferroelectric hafnium zirconium oxide film is $Hf_xZr_{(1-x)}O_2$, with x about 0.5.

8. The ferroelectric tunnel junction of claim 7, wherein said first and second conductive materials are at least one of: TiN, Au, Pt, graphene, Ir/$IrO_2$ and niobium-doped strontium titanate.

9. A memory device comprising a ferroelectric tunnel junction according to claim 8.

10. The ferroelectric tunnel junction of claim 7, wherein said first and second conductive materials are oxygen-containing materials.

11. A memory device comprising a ferroelectric tunnel junction according to claim 10.

12. The ferroelectric tunnel junction of claim 7, wherein said top and bottom electrodes have a thickness in a range between monolayers and 100 nanometers.

13. A memory device comprising a ferroelectric tunnel junction comprising a ferroelectric hafnium zirconium oxide film barrier layer, a bottom and a top electrode, said hafnium zirconium oxide film barrier layer being a layer of $Hf_xZr_{(1-x)}O_2$, with x about 0.5 of a thickness of at most 5 nanometers grown by sputtering in a 1:1 mixture of Ar and $O_2$ at a temperature of at most about 425° C. on a conductive material as the bottom electrode.

14. A memory device comprising a ferroelectric tunnel junction comprising a ferroelectric hafnium zirconium oxide film barrier layer between a bottom electrode and a top electrode, said ferroelectric hafnium zirconium oxide film barrier layer being a film of $Hf_xZr_{(1-x)}O_2$ with x about 0.5 of a thickness of at most 5 nanometers grown by sputtering in a 1:1 mixture of Ar and $O_2$ at a temperature of at most about 425° C. on a conductive material as the bottom electrode.

* * * * *